United States Patent
Azadet

(10) Patent No.: US 9,960,900 B2
(45) Date of Patent: May 1, 2018

(54) MODELING OF A PHYSICAL SYSTEM USING TWO-DIMENSIONAL LOOK-UP TABLE AND LINEAR INTERPOLATION

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 14/230,607

(22) Filed: Mar. 31, 2014

(65) Prior Publication Data

US 2014/0314176 A1    Oct. 23, 2014

Related U.S. Application Data

(60) Provisional application No. 61/812,858, filed on Apr. 17, 2013.

(51) Int. Cl.
   *H04K 1/02* (2006.01)
   *H04L 25/03* (2006.01)
   (Continued)

(52) U.S. Cl.
   CPC ........ *H04L 5/1461* (2013.01); *G06F 9/30036* (2013.01); *G06F 17/15* (2013.01);
   (Continued)

(58) Field of Classification Search
   CPC .................. G06F 17/5009; H04B 1/62; H04B 2001/0425; H04L 1/0043; H04L 27/367; H04L 27/368
   See application file for complete search history.

(56) References Cited

U.S. PATENT DOCUMENTS 4,673,941 A    6/1987   Van Der Mark
4,884,265 A    11/1989  Schroeder et al.
(Continued)

FOREIGN PATENT DOCUMENTS

EP          2256937 A1    12/2010
KR      20050064485 A     6/2005
(Continued)

OTHER PUBLICATIONS

Nagata, Y., "Linear amplification technique for digital mobile communications," in Vehicular Technology Conference, 1989, IEEE 39th , vol., No., pp. 159-164 vol. 1, May 1-3, 1989.*
(Continued)

*Primary Examiner* — Sam K Ahn
*Assistant Examiner* — Amneet Singh
(74) *Attorney, Agent, or Firm* — Viering, Jentschura & Partner mbB

(57) ABSTRACT

Methods and apparatus are provided for modeling of a physical system using two-dimensional look-up tables. A method can include determining coefficients for a piece-wise polynomial function that estimates a non-linear function, storing the coefficients as entries in one or more two-dimensional look up tables in the memory, receiving a complex value input corresponding to an actual input value, identifying two closest entries, a first closest entry and a second closest entry, to the complex input value in a two-dimensional look-up table of the one or more two-dimensional look-up tables, evaluating, using the one or more hardware processors, the piece-wise polynomial function at the complex input value twice, a first evaluation using the coefficients corresponding to the first closest entry and a second evaluation using the coefficients corresponding to the second closest entry, to generate first and second output values, and generating an output value by performing a
(Continued)

linear interpolation between the first and second output values.

11 Claims, 4 Drawing Sheets

(51) Int. Cl.
| | |
|---|---|
| H04L 25/49 | (2006.01) |
| H04L 5/14 | (2006.01) |
| H04L 25/08 | (2006.01) |
| G06F 17/50 | (2006.01) |
| H04B 1/62 | (2006.01) |
| H04L 1/00 | (2006.01) |
| H04B 1/04 | (2006.01) |
| G06F 17/15 | (2006.01) |
| G06F 9/30 | (2018.01) |
| H04L 27/36 | (2006.01) |
| H04J 11/00 | (2006.01) |
| H04B 1/525 | (2015.01) |

(52) U.S. Cl.
CPC .......... *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(56) References Cited

U.S. PATENT DOCUMENTS

| | | | |
|---|---|---|---|
| 5,276,633 A | 1/1994 | Fox et al. | |
| 5,381,357 A | 1/1995 | Wedgwood et al. | |
| 5,416,845 A | 5/1995 | Qun | |
| 5,596,600 A | 1/1997 | Dimos et al. | |
| 5,706,314 A | 1/1998 | Davis et al. | |
| 5,896,304 A | 4/1999 | Tiemann | |
| 5,903,611 A * | 5/1999 | Schnabl | H03F 1/3247 375/296 |
| 5,949,831 A | 9/1999 | Coker et al. | |
| 6,118,832 A | 9/2000 | Mayrargue et al. | |
| 6,150,976 A | 11/2000 | Cooley | |
| 6,151,682 A | 11/2000 | van der Wal et al. | |
| 6,158,027 A | 12/2000 | Bush et al. | |
| 6,163,788 A | 12/2000 | Chen et al. | |
| 6,298,097 B1 * | 10/2001 | Shalom | H03F 1/3241 375/296 |
| 6,446,193 B1 | 9/2002 | Alidina et al. | |
| 6,496,609 B1 * | 12/2002 | Walter | G06T 3/4007 358/525 |
| 6,529,925 B1 | 3/2003 | Schenk | |
| 6,574,649 B2 | 6/2003 | McGrath | |
| 6,580,768 B1 | 6/2003 | Jaquette | |
| 6,587,514 B1 | 7/2003 | Wright et al. | |
| 6,625,235 B1 | 9/2003 | Coker et al. | |
| 6,643,814 B1 | 11/2003 | Cideciyan et al. | |
| 6,798,843 B1 | 9/2004 | Wright et al. | |
| 6,801,086 B1 | 10/2004 | Chandrasekaran | |
| 7,039,091 B1 | 5/2006 | Mauer | |
| 7,058,369 B1 * | 6/2006 | Wright | H01Q 1/243 375/297 |
| 7,110,477 B2 | 9/2006 | Suissa et al. | |
| 7,133,387 B2 | 11/2006 | Nakada | |
| 7,167,513 B2 | 1/2007 | Tsui et al. | |
| 7,242,725 B2 | 7/2007 | Matsumoto et al. | |
| 7,313,373 B1 | 12/2007 | Laskharian et al. | |
| 7,336,730 B2 | 2/2008 | Auranen et al. | |
| 7,349,375 B2 | 3/2008 | Gerakoulis | |
| 7,441,105 B1 | 10/2008 | Metzgen | |
| 7,471,739 B1 | 12/2008 | Wright | |
| 7,477,634 B1 | 1/2009 | McKown | |
| 7,593,492 B1 | 9/2009 | Lande | |
| 7,606,292 B1 | 10/2009 | Harris et al. | |
| 7,613,228 B2 | 11/2009 | Niedzwiecki | |
| 7,656,837 B2 | 2/2010 | Gerakoulis | |
| 7,869,482 B2 | 1/2011 | Kubota et al. | |
| 7,895,252 B2 | 2/2011 | Sazegari et al. | |
| 7,924,942 B2 | 4/2011 | Rexberg | |
| 8,331,509 B2 | 12/2012 | Wang et al. | |
| 8,516,028 B2 | 8/2013 | Yu | |
| 8,583,152 B2 | 11/2013 | Ishii et al. | |
| 8,711,988 B2 | 4/2014 | Chen | |
| 8,831,133 B2 | 9/2014 | Azadet et al. | |
| 8,897,388 B2 | 11/2014 | Molina et al. | |
| 8,982,992 B2 | 3/2015 | Azadet et al. | |
| 9,225,501 B2 | 12/2015 | Azadet | |
| 2001/0043582 A1 | 11/2001 | Nakada | |
| 2001/0050592 A1 * | 12/2001 | Wright | H03F 1/3241 330/2 |
| 2001/0050926 A1 | 12/2001 | Kumar | |
| 2002/0057735 A1 | 5/2002 | Piirainen | |
| 2002/0062436 A1 | 5/2002 | Van Hook et al. | |
| 2002/0101835 A1 | 8/2002 | Gerakoulis | |
| 2002/0152248 A1 * | 10/2002 | Bentz | G06F 17/17 708/290 |
| 2003/0112904 A1 | 6/2003 | Fuller et al. | |
| 2003/0152165 A1 | 8/2003 | Kondo et al. | |
| 2003/0223505 A1 | 12/2003 | Verbin et al. | |
| 2004/0052314 A1 | 3/2004 | Copeland | |
| 2004/0120420 A1 | 6/2004 | Hongo et al. | |
| 2004/0180679 A1 | 9/2004 | Porter | |
| 2004/0202137 A1 | 10/2004 | Gerakoulis | |
| 2004/0248516 A1 | 12/2004 | Demir et al. | |
| 2005/0001675 A1 | 1/2005 | Saed | |
| 2005/0036575 A1 | 2/2005 | Kuchi et al. | |
| 2005/0108002 A1 | 5/2005 | Nagai et al. | |
| 2005/0111574 A1 | 5/2005 | Muller et al. | |
| 2005/0140438 A1 * | 6/2005 | Jin | H03F 1/3241 330/149 |
| 2005/0243946 A1 * | 11/2005 | Chung | H03F 1/3247 375/297 |
| 2006/0029149 A1 | 2/2006 | Kim et al. | |
| 2006/0109938 A1 | 5/2006 | Challa et al. | |
| 2006/0176969 A1 | 8/2006 | Trivedi | |
| 2006/0198466 A1 | 9/2006 | Wright et al. | |
| 2006/0240786 A1 | 10/2006 | Liu | |
| 2007/0005674 A1 | 1/2007 | Sazegari et al. | |
| 2007/0087770 A1 | 4/2007 | Gan | |
| 2007/0189402 A1 | 8/2007 | Yang | |
| 2008/0019422 A1 | 1/2008 | Smith et al. | |
| 2008/0027720 A1 | 1/2008 | Kondo et al. | |
| 2008/0030388 A1 | 2/2008 | Muck et al. | |
| 2008/0056403 A1 | 3/2008 | Wilson | |
| 2008/0074155 A1 | 3/2008 | Jaklitsch | |
| 2008/0095265 A1 | 4/2008 | Cai et al. | |
| 2008/0107046 A1 | 5/2008 | Kangasmaa et al. | |
| 2008/0123770 A1 * | 5/2008 | Copeland | H03F 1/3247 375/285 |
| 2008/0133982 A1 * | 6/2008 | Rawlins | H03F 1/0211 714/699 |
| 2008/0144539 A1 | 6/2008 | Sperlich et al. | |
| 2008/0187057 A1 | 8/2008 | Qu | |
| 2008/0192860 A1 | 8/2008 | Harwood et al. | |
| 2008/0219220 A1 | 9/2008 | Gerakoulis | |
| 2008/0247487 A1 | 10/2008 | Cai et al. | |
| 2008/0267261 A1 | 10/2008 | Wang et al. | |
| 2008/0316076 A1 | 12/2008 | Dent et al. | |
| 2009/0006514 A1 | 1/2009 | Kountouris | |
| 2009/0029664 A1 | 1/2009 | Batruni | |
| 2009/0051425 A1 * | 2/2009 | Mehta | H03F 1/3247 330/149 |
| 2009/0051426 A1 * | 2/2009 | Ba | H03F 1/3247 330/149 |
| 2009/0079627 A1 | 3/2009 | Sun et al. | |
| 2009/0116576 A1 | 5/2009 | Dowling | |
| 2009/0164542 A1 | 6/2009 | Wu et al. | |
| 2009/0225899 A1 | 9/2009 | Dent | |

(56) References Cited

U.S. PATENT DOCUMENTS

| | | |
|---|---|---|
| 2009/0245406 A1 | 10/2009 | Moffatt et al. |
| 2009/0256632 A1 | 10/2009 | Klingberg et al. |
| 2009/0257421 A1 | 10/2009 | Nakashima et al. |
| 2009/0285335 A1 | 11/2009 | Hoshuyama |
| 2010/0027592 A1 | 2/2010 | Arviv et al. |
| 2010/0067511 A1 | 3/2010 | Peters |
| 2010/0098139 A1 | 4/2010 | Braithwaite |
| 2010/0105338 A1* | 4/2010 | Wang ............ H03F 1/3241 455/73 |
| 2010/0124257 A1 | 5/2010 | Yahya |
| 2010/0138463 A1* | 6/2010 | Azadet ............ G06F 1/035 708/290 |
| 2010/0138464 A1* | 6/2010 | Azadet ............ G06F 1/035 708/290 |
| 2010/0138465 A1 | 6/2010 | Azadet et al. |
| 2010/0138468 A1 | 6/2010 | Azadet et al. |
| 2010/0144333 A1 | 6/2010 | Kiasaleh et al. |
| 2010/0158051 A1 | 6/2010 | Hadzic et al. |
| 2010/0198893 A1 | 8/2010 | Azadet et al. |
| 2010/0198894 A1 | 8/2010 | Azadet et al. |
| 2010/0225390 A1 | 9/2010 | Brown et al. |
| 2010/0244953 A1* | 9/2010 | Brown ............ H03F 1/26 330/149 |
| 2010/0246714 A1 | 9/2010 | Yang et al. |
| 2010/0255867 A1 | 10/2010 | Ishii et al. |
| 2010/0273427 A1 | 10/2010 | Mergen et al. |
| 2010/0316112 A1 | 12/2010 | Huang et al. |
| 2010/0316157 A1* | 12/2010 | Bassam ............ H04L 25/03343 375/267 |
| 2011/0002249 A1 | 1/2011 | Gerakoulis |
| 2011/0007907 A1 | 1/2011 | Park et al. |
| 2011/0019724 A1 | 1/2011 | Agazzi |
| 2011/0025414 A1 | 2/2011 | Wolf et al. |
| 2011/0055303 A1 | 3/2011 | Slavin |
| 2011/0059710 A1 | 3/2011 | Cai et al. |
| 2011/0080902 A1 | 4/2011 | Jang |
| 2011/0096824 A1 | 4/2011 | Agazzi et al. |
| 2011/0149714 A1 | 6/2011 | Rimini et al. |
| 2011/0150130 A1 | 6/2011 | Kenington |
| 2011/0170421 A1 | 7/2011 | Gerakoulis |
| 2011/0228828 A1 | 9/2011 | Wang et al. |
| 2011/0255011 A1 | 10/2011 | Gu et al. |
| 2011/0268167 A1 | 11/2011 | Sundstroem |
| 2011/0302230 A1 | 12/2011 | Ekstrand |
| 2012/0036174 A1 | 2/2012 | Yu |
| 2012/0087406 A1 | 4/2012 | Lim et al. |
| 2012/0093209 A1 | 4/2012 | Schmidt et al. |
| 2012/0106614 A1 | 5/2012 | Kim et al. |
| 2012/0188994 A1 | 7/2012 | Palanki et al. |
| 2012/0269292 A1* | 10/2012 | Wang ............ H04B 1/0475 375/297 |
| 2012/0269293 A1* | 10/2012 | Peng ............ H04B 1/0475 375/297 |
| 2012/0280840 A1 | 11/2012 | Kyeong et al. |
| 2012/0295657 A1 | 11/2012 | Okazaki |
| 2013/0007082 A1 | 1/2013 | Elenes |
| 2013/0022157 A1 | 1/2013 | Hollevoet et al. |
| 2013/0044794 A1 | 2/2013 | Wenzel et al. |
| 2013/0070867 A1 | 3/2013 | To et al. |
| 2013/0114652 A1 | 5/2013 | Molina et al. |
| 2013/0114761 A1 | 5/2013 | Azadet et al. |
| 2013/0114762 A1 | 5/2013 | Azadet et al. |
| 2013/0117342 A1 | 5/2013 | Azadet et al. |
| 2013/0195007 A1 | 8/2013 | Mazurenko et al. |
| 2013/0243123 A1* | 9/2013 | Bai ............ H04L 27/367 375/297 |
| 2014/0016626 A1 | 1/2014 | Dai et al. |
| 2014/0064417 A1 | 3/2014 | Azadet |
| 2014/0072073 A1 | 3/2014 | Azadet et al. |
| 2014/0075162 A1 | 3/2014 | Azadet et al. |
| 2014/0086356 A1 | 3/2014 | Azadet et al. |
| 2014/0086361 A1 | 3/2014 | Azadet et al. |
| 2014/0086367 A1 | 3/2014 | Azadet et al. |
| 2014/0108477 A1 | 4/2014 | Azadet et al. |
| 2014/0218107 A1* | 8/2014 | Geng ............ H03F 1/0211 330/149 |
| 2014/0313946 A1 | 10/2014 | Azadet |
| 2014/0314176 A1 | 10/2014 | Azadet |
| 2014/0314181 A1 | 10/2014 | Azadet |
| 2014/0314182 A1 | 10/2014 | Azadet |
| 2014/0316752 A1 | 10/2014 | Azadet |
| 2014/0317163 A1 | 10/2014 | Azadet et al. |
| 2014/0317376 A1 | 10/2014 | Azadet |
| 2015/0070089 A1 | 3/2015 | Eliaz et al. |
| 2015/0146822 A1 | 5/2015 | Copeland |

FOREIGN PATENT DOCUMENTS

| | | |
|---|---|---|
| WO | 2007010331 A1 | 1/2007 |
| WO | 2007104362 A1 | 9/2007 |
| WO | 2008057584 A2 | 5/2008 |
| WO | 2011058843 A1 | 5/2011 |
| WO | 2011101233 A1 | 8/2011 |
| WO | 2013007188 A1 | 1/2013 |
| WO | 2013063434 A1 | 5/2013 |
| WO | 2013063440 A1 | 5/2013 |
| WO | 2013063443 A1 | 5/2013 |
| WO | 2013063447 A2 | 5/2013 |
| WO | 2013063450 A1 | 5/2013 |
| WO | 2013066756 A2 | 5/2013 |

OTHER PUBLICATIONS

Hao Li; Kwon, D.H.; Deming Chen; Yun Chiu, "A Fast Digital Predistortion Algorithm for Radio-Frequency Power Amplifier Linearization With Loop Delay Compensation," in Selected Topics in Signal Processing, IEEE Journal of, vol. 3, No. 3, pp. 374-383, Jun. 2009.*

Minglu Jin; Sooyoung Kim; Doseob Ahn; Oh, D.-G.; Jae Moung Kim, "A fast LUT predistorter for power amplifier in OFDM systems," in Personal, Indoor and Mobile Radio Communications, 2003. PIMRC 2003. 14th IEEE Proceedings on , vol. 2, No., pp. 1894-1897 vol. 2, Sep. 7-10, 2003.*

Chao Lu; Hua Wang; Peng, C.H.; Goel, A.; SangWon Son; Liang, P.; Niknejad, A.; Hwang, H.C.; Chien, G., "A 24.7dBm all-digital RF transmitter for multimode broadband applications in 40nm CMOS," in Solid-State Circuits Conference Digest of Technical Papers (ISSCC), 2013 IEEE International , vol., No., pp. 332-333, Feb. 17-21, 2013.*

"Bilinear interpolation" retrieved from https://web.archive.org/web/20110921104425/http://en.wikipedia.org/wiki/Bilinear_interpolation, published on Sep. 21, 2011.*

W. J. Kim, K. J. Cho, S. P. Stapleton and J. H. Kim, "Piecewise Pre-Equalized Linearization of the Wireless Transmitter With a Doherty Amplifier," in IEEE Transactions on Microwave Theory and Techniques, vol. 54, No. 9, pp. 3469-3478, Sep. 2006.*

U.S. Appl. No. 14/168,621, filed Jan. 30, 2014, Non-Linear Modeling of a Physical System Using Direct Optimization of Look-Up Table Values.

U.S. Appl. No. 14/255,491, filed Apr. 17, 2014, Digital Processor Having Instruction Set With Complex Angle Function.

U.S. Appl. No. 14/230,622, filed Mar. 31, 2014, Non-Linear Modeling of a Physical System Using Look-Up Table With Polynomial Interpolation, U.S. Pat. No. 9,225,501.

U.S. Appl. No. 14/230,635, filed Mar. 31, 2014, Non-Linear Interference Cancellation for Wireless Transceivers.

"U.S. Appl. No. 14/230,622, Non Final Office Action dated Apr. 14, 2015", 22 pgs.

"U.S. Appl. No. 14/230,622, Notice of Allowance dated Aug. 28, 2015", 14 pgs.

"U.S. Appl. No. 14/230,622, Response filed Jul. 14, 2015 to Non Final Office Action dated Apr. 14, 2015", 14 pgs.

"U.S. Appl. No. 14/230,635, Non Final Office Action dated Dec. 4, 2015", 17 pgs.

Notice of Allowance received for U.S. Appl. No. 14/168,615 dated Feb. 4, 2016, 7 pages.

(56) References Cited

OTHER PUBLICATIONS

Wegener, A.: "High-Performance Crest Factor Reduction Processor for W-CDMA and Applications", Radio Frequency Integrated Circuits (RFIC) Symposium, Jun. 2006, 4 pages, IEEE, USA.
Gopalan R. et al.: "An Optimization Approach to Single-Bit Quantization", IEEE Transaction on Circuits and Systems I: Regular Papers, Dec. 2009, pp. 2655-2668, vol. 56, Issue 12, IEEE, USA.
Gopalan R. et al.: "On an optimum algorithm for waveform synthesis and its applications to digital transmitters", Wireless Communications and Networking Conference, Mar. 2005, pp. 1108-1113, vol. 2, IEEE, USA.
Venkatamaran J. et al.: "An All-Digital Transmitter with a 1-Bit DAC", IEEE Transaction on Communications, Oct. 2007, pp. 1951-1962, vol. 55, Issue 10, IEEE, USA.
Li: "FIR Filtering Using Vector Transformation and Convolution Processor", 1990, IEEE, pp. 1223-1226.
Non-Final Office Action received for U.S. Appl. No. 14/255,491 dated Jun. 16, 2016, 11 pages.
Final Office Action received for U.S. Appl. No. 14/230,635 dated Jun. 30, 2016, 13 pages.
International Search Report based on Application No. PCT/EP2016/056810 (4 Pages) dated Nov. 29, 2016 (Reference Purpose Only).
Non-Final Office Action received for the corresponding U.S. Appl. No. 14/255,499, dated Jun. 15, 2017 (60 Pages).
Office Action received for the U.S. Appl. No. 15/191,583, dated Aug. 11, 2017, 17 pages.
Lei Ding, "Digital Predistortion of Power Amplifiers for Wireless Applications", School of Electrical and Computer Engineering Georgia Institute of Technology PhD thesis, Mar. 2004.
Maarten Schoukens et al., "Parametric Identification of Parallel Wiener Systems", IEEE Transactions on Instrumentation and Measurement, Oct. 2012, pp. 2825-2832, vol. 61, No. 10, IEEE.
Notice of Allowance received for the U.S. Appl. No. 14/255,499, dated Nov. 17, 2017, 17 pages.

\* cited by examiner

300

400

MODELING OF A PHYSICAL SYSTEM USING TWO-DIMENSIONAL LOOK-UP TABLE AND LINEAR INTERPOLATION

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to U.S. patent application Ser. No. 14/168,621, filed Jan. 30, 2014, entitled "Non-Linear Modeling of a Physical System Using Direct Optimization of Look-Up Table Values;" PCT Patent Application No. PCT/US12/62179, filed Oct. 26, 2012, entitled "Software Digital Front End (SoftDFE) Signal Processing;" and PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," each incorporated by reference herein.

FIELD OF THE INVENTION

The present invention is related to digital signal processing techniques and, more particularly, to techniques for modeling of non-linear systems.

BACKGROUND OF THE INVENTION

Digital pre-distortion (DPD) is a technique used to linearize a power amplifier in a transmitter to improve the efficiency of the power amplifier. A digital pre-distortion circuit inversely models the gain and phase characteristics of the power amplifier and, when combined with the amplifier, produces an overall system that is more linear and reduces distortion than would otherwise be caused by the power amplifier. An inverse distortion is introduced into the input of the amplifier, thereby reducing any non-linearity that the amplifier might otherwise exhibit.

PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," discloses non-linear functions that include one or more parameters specified by a user, such as filter coefficient values or values from a look-up table. The disclosed DPD techniques are based on a generalized memory polynomial (GMP) model and implemented using look-up tables. Polynomial models, however, do not provide adequate performance for a number of common situations. For example, polynomial models do not capture functions that have discontinuities in them (such as a discontinuity of amplitude or derivative, or a higher order derivative).

Chao Lu et al., "A 24.7 dBm All-Digital RF Transmitter for Multimode Broadband Applications in 40 nm CMOS," IEEE Int'l Solid-State Circuits Conference (ISSCC) 19.3 (San Francisco, 2013) describes a technique for using two-dimensional look-up tables to implement a non-linear function with a complex input variable, selecting a value of a complex valued non-linear function based on the input value comprised of real and imaginary components. Generally, two-dimensional look-up tables avoid the need to compute the magnitude of the complex signal and also allows the potential I/Q mismatch in the RF signal to be taken into account in Zero IF (ZIF) architectures. Two-dimensional look-up tables, however, have a complexity on the order of $N^2$, where N is the number of discrete points for each of the real or imaginary parts. Thus, the cost of the silicon and power concerns are issues to be addressed, particularly in battery operated handset applications.

A need therefore remains for improved techniques for modeling non-linear systems using two-dimensional look-up tables with reduced size.

SUMMARY OF THE INVENTION

Generally, improved techniques are provided for non-linear modeling of a physical system using two-dimensional look-up tables with bilinear interpolation. According to one aspect of the invention, a non-linear function is evaluated for a complex input value by obtaining a two-dimensional look-up table with bilinear interpolation that represents the non-linear function; obtaining four points from the two-dimensional look-up table that are in a vicinity of the complex input value; and generating a complex output value comprised of a bilinear combination of the four points. The non-linear function characterizes, for example, a power amplifier or an inverse of a power amplifier. The two-dimensional look-up tables can be used, for example, to implement digital pre-distortion.

According to another aspect of the invention, values in the two-dimensional look-up table are obtained using a direct optimization technique that obtains physical data for the non-linear function by applying a set of complex input samples x(n) to the non-linear function and measuring a complex output y(n) of the non-linear function; and directly computes parameters $\Phi$ of a memory model for the non-linear function from the physical data, wherein the memory model comprises one or more two-dimensional look-up tables having bilinear interpolation and wherein the parameters $\Phi$ produce a substantially minimum mean square error, wherein the parameters $\Phi$ are provided for storage as entries in the one or more of the two-dimensional look-up tables.

According to yet another aspect of the invention, the two-dimensional look-up tables with bilinear interpolation are used in a processor instruction as part of an instruction set of one or more of a scalar processor and a vector processor. The look-up table can be stored in a memory of a digital processor, and the bilinear interpolation is performed as part of a user-defined non-linear instruction that takes a complex number as an input, x, and computes f(x).

A more complete understanding of the present invention, as well as further features and advantages of the present invention, will be obtained by reference to the following detailed description and drawings.

DETAILED DESCRIPTION

Aspects of the present invention provide improved techniques for modeling non-linear systems, such as a DPD system or a power amplifier. According to one aspect of the invention, a physical system, such as a DPD system, is modeled using a non-linear model with two-dimensional look-up table values. In one exemplary embodiment, the complex input and complex output data of a physical system are used to directly determine the values that are stored in the exemplary two-dimensional look-up tables that implement the non-linear model. The model comprises one or more two-dimensional look-up tables having bilinear interpolation.

Existing DPD techniques are typically based on a generalized memory polynomial (GMP) model and are implemented using look-up tables. GMP itself models an ideal Volterra series. GMP models an actual physical system such as a reverse power amplifier response (i.e., output to input response). The look-up tables are obtained by first computing the coefficients of each of the GMP polynomials using conventional techniques (e.g., a least squares approach) and then sampling each of the polynomials to create the look-up tables for each polynomial. This can be considered modeling a model, or approximating an approximation. The look-up tables approximate the GMP polynomial model, which is itself an approximation of an ideal infinite tap Volterra-based pre-distorter.

Aspects of the present invention recognize that polynomial models do not work well over an extended interval of input signal and do not work well in the presence of a discontinuity (e.g., a derivative discontinuity). In addition, aspects of the present invention recognize that two-dimensional look-up tables will perform better in these cases.

Thus, aspects of the present invention provide a non-linear model with two-dimensional look-up tables and bilinear interpolation. In one exemplary embodiment, the values for the look-up tables are directly optimized from physical data. Bilinear interpolation is commonly used, for example, in computer graphics applications to perform image resizing. See, for example, http://en.wikipedia.org/wiki/Bilinear_interpolation.

Aspects of the present invention recognize that bilinear interpolation between points in a two-dimensional (2D) look-up table (LUT) can be employed to reduce the required size of the 2D LUT. Thus, according to one aspect of the invention, the approximation accuracy of the 2D LUT is improved by performing bilinear interpolation between the four closest points to the input complex value.

Figure 1:
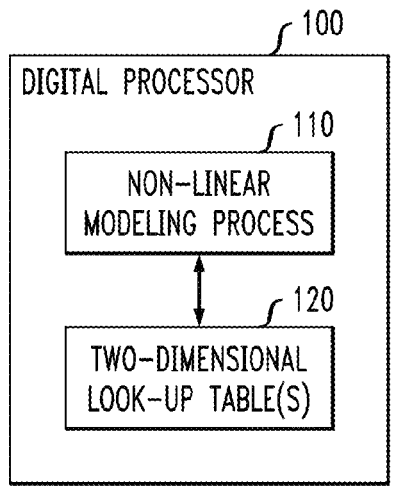
FIG. 1 is a schematic block diagram of an exemplary digital processor that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes a non-linear modeling process 110, as discussed further below in conjunction with FIG. 2, for optimizing physical data, for example, using a mean-square error approach, to determine the values to be stored in one or more exemplary two-dimensional (2D) look-up tables 120 that implement the non-linear model. The exemplary two-dimensional (2D) look-up tables 120 are in the memory of the digital processor 100.

The disclosed digital processors 100 may have a scalar architecture that processes a single complex number at a time, or a vector architecture that processes one or more complex numbers simultaneously. In the case of a vector-based digital processor implementation, the input complex number is a vector comprised of a plurality of scalar complex numbers that are processed in parallel.

A vector-based digital signal processor 100 may contain plural functional units for performing the functions described herein. For example, a dual digital signal processor 100 contains two functional units that are capable of performing two independent non-linear function operations concurrently.

Generally, aspects of the present invention extend conventional digital signal processors to provide an enhanced instruction set that supports non-linear functions using one or more look-up tables. The digital signal processor 100 in accordance with the present invention receives at least one number as an input, applies a function to the input and generates an output value.

Figure 2:
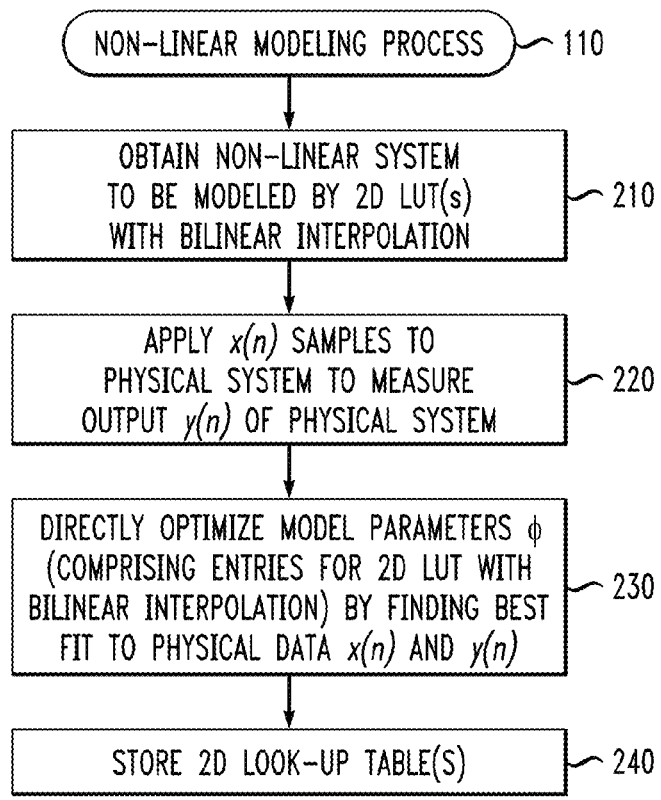
FIG. 2 is a flow chart illustrating an exemplary implementation of the non-linear modeling process of FIG. 1 incorporating aspects of the present invention.

FIG. 2 is a flow chart illustrating an exemplary implementation of the non-linear modeling process 110 of FIG. 1 incorporating aspects of the present invention. As shown in FIG. 2, the exemplary non-linear modeling process 110 initially obtains the non-linear system (real) to be modeled in accordance aspects of the invention during step 210. The model comprises a 2D LUT with Bilinear interpolation. The non-linear system is defined by an unknown non-linear function f(x), similar to the functions described in PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications:"

$$f(x)=y.$$

The function f(x) is thus an unknown function defining the response of the actual physical system to be modeled, such as a reverse power amplifier response. Aspects of the present invention model the response f(x) of the actual physical system using a model $\hat{f}(x)$ and estimate the parameters (2D LUT entries) of this model $\hat{f}(x)$ by performing direct optimization using the physical data.

As discussed hereinafter, the parameters (2D LUT entries) of the model $\hat{f}(x)$ are obtained using measured data x(n) and y(n). For example, to model the response of a power amplifier, x(n) is used as the complex input of the power amplifier and y(n) is used as the complex output of the power amplifier. Likewise, to model the inverse response of the power amplifier a conceptual system or black box is considered that has as its complex input the power amplifier output and as its complex output the power amplifier input.

Thus, the non-linear modeling process 110 applies the complex input samples x(n) to the physical system to measure a set of N complex output samples y(n)(n=0 to N−1) during step 220 to obtain the physical data for the system:

$$f(x_n)=y_n$$

The non-linear modeling process 110 then directly optimizes the parameters Φ for the model during step 230 to find the best fit for the measured physical data. Generally, as discussed further below, the best fit identifies the parameters that provide a substantially minimum value for an exemplary mean square error using a least squares algorithm. In further variations, alternative algorithms can use, for example, recursive least squares (RLS) or least mean square (LMS) that achieve various trade-offs between complexity and conversion speed.

As discussed further below, the model parameters comprise the entries for the 2D LUT(s) with bilinear interpolation, referred to as $\hat{f}(x)$ of $f(x)$. The 2D LUTs with bilinear interpolation are then stored during step 240.

Static Model for Complex Signals

LUT parameter modeling and parameter estimation can be employed for the case of non-linear systems with complex inputs and complex outputs using an AM-AM/AM-PM model:

$$y(n)=f(|x(n)|)x(n)$$

where the gain is signal dependent (i.e., a non-linear gain and phase relationship). The non-linear function f in this conventional one-dimensional model is a function of a real number |x| (magnitude of x). The one-dimensional model, however, does not capture any distortion of real/imaginary parts independently. Aspects of the present invention therefore introduce a 2D model that directly gives y(n) as y(n)=f(x(n)), where x is a complex signal. In this case, the non-linear function f is a 2D function (x has real and imaginary parts).

Figure 3:
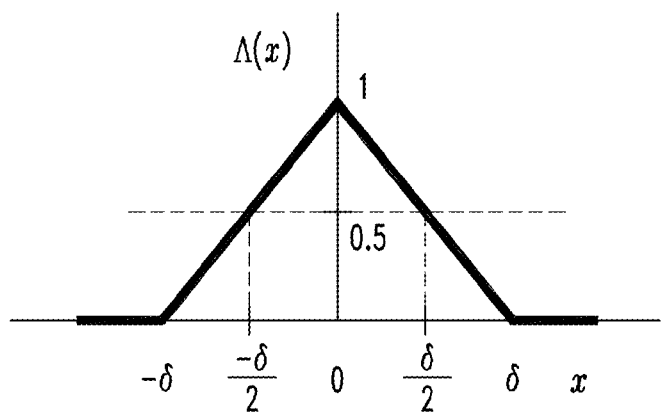
FIG. 3 illustrates a triangular basis function.

Thus, one difference with a model for real inputs/real outputs is that for complex inputs and outputs, f(|.|) appears as a non-linear gain, and not directly as the output amplitude. This model is referred to as Model G (G as in gain). The model is employed with complex values stored in the 2D look-up table, as follows:

The 2D LUT with bilinear interpolation of the function f can be written as:

$$\hat{f}(x) = \sum_{p=0}^{P-1} \sum_{q=0}^{P-1} \varphi_{p,q} \Lambda(x-(p+jq)\delta-\gamma),$$

where $$\gamma = \frac{P(1+j)\delta}{2}$$

is a constant offset to center the 2D raster on 0 and $\Lambda$ is the triangular basis function 300 shown in FIG. 3, and $\varphi_{p,q}$ is the desired unknown 2D look-up table entries.

For arbitrary values of x, using a discrete shift, it can be shown that this decomposition is equivalent to a bilinear interpolation $\hat{f}(x)$ between 4 values of $f(x)$ in a 2D LUT containing samples off in the discrete raster of resolution d.

Moreover, similar to the linear interpolation in the 1D LUT case described in U.S. patent application Ser. No. 14/168,621, filed Jan. 30, 2014, entitled "Non-Linear Modeling of a Physical System Using Direct Optimization of Look-Up Table Values," where coefficients of interpolation sum up to Unity, it can be shown that the four coefficients of the bilinear interpolation also sum up to Unity. Similar to the 1D LUT case, the estimate $\hat{f}(x)$ of $f(x)$ is in linear relationship with the 2D LUT entries.

Let:

$$u_{k,n}=\Lambda(x_n-(p+jq)\delta-\gamma),$$

where k=qP+p. The $\Lambda$ function is discussed further below in conjunction with FIG. 5.

The approximation error can be written as:

$$e_n=\hat{f}(x_n)-y_n$$

The optimization performed during step 230 comprises finding a minimum of the cost function, C, given by:

$$\Phi=(U^H U)^{-1} \cdot U^H Y,$$

where $\Phi$ is a vector comprised of the entries for the 2D look-up tables and H indicates a Hermitian matrix. It is noted that the function $\Phi$ is a function of the complex output Y and the matrix U which is itself a function of the complex input signal x(n). This expression is for the case where x and y are complex signals.

Figure 4:
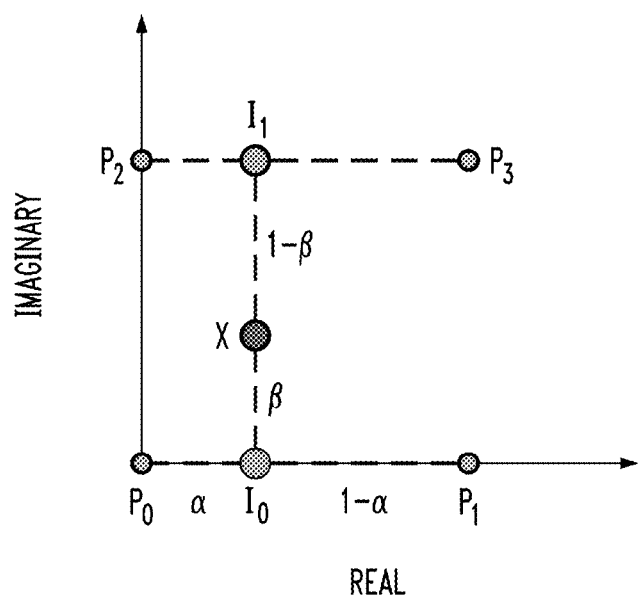
FIG. 4 illustrates an exemplary conventional bilinear interpolation for a given point between four points $P_0$, $P_1$, $P_2$, $P_3$ from a two-dimensional look-up table.

FIG. 4 illustrates an exemplary conventional bilinear interpolation 400 for a point X, between four points $P_0$, $P_1$, $P_2$, $P_3$ from a 2D look-up table. Generally, the bilinear interpolation is implemented as two linear interpolations as shown in FIG. 4. A first linear interpolation is performed along the real axis using $P_0$ and $P_1$ to find $I_0$, $\alpha$, and $1-\alpha$. A second linear interpolation is performed using $P_2$ and $P_3$ to find $I_1$. The two points $I_0$ and $I_1$ are then processed to obtain X, in a known manner.

Figure 5A:
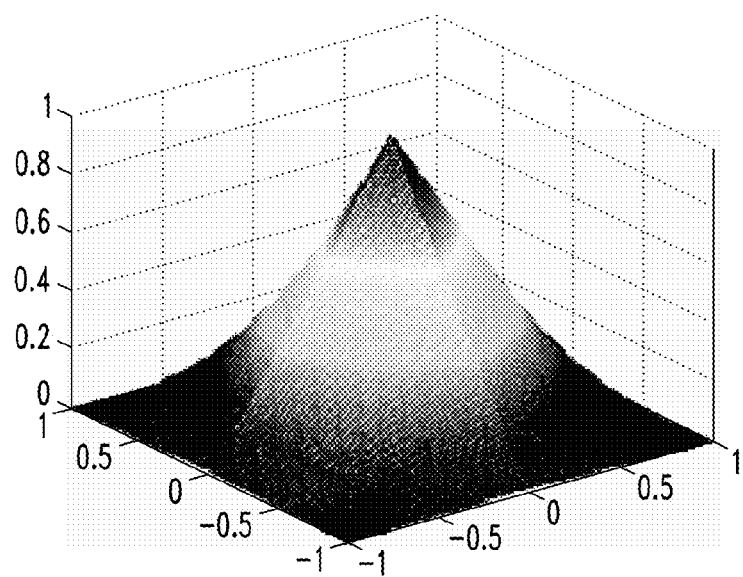
FIGS. 5A and 5B illustrate mesh and contour plots, respectively, of the function $\Lambda(z)$.
Figure 5B:
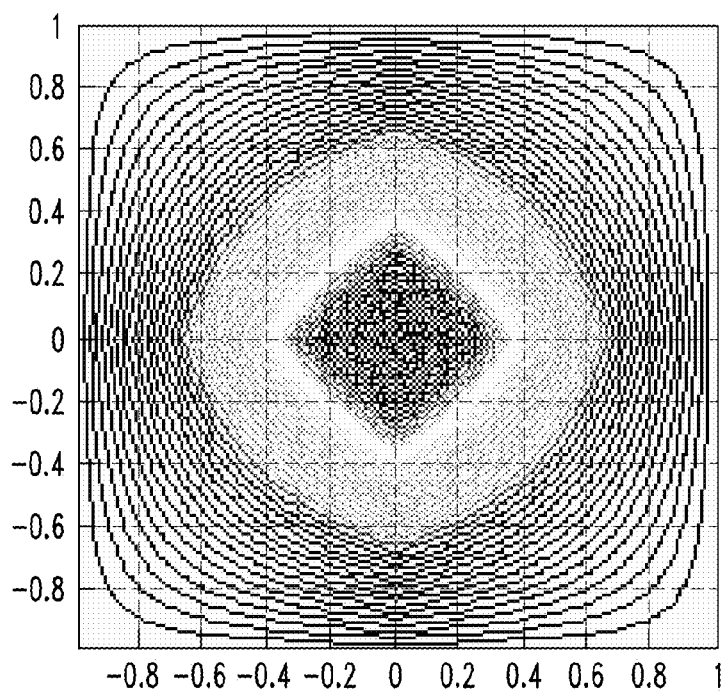

FIGS. 5A and 5B illustrate mesh and contour plots, respectively, of the function $\Lambda(z)$. The following exemplary two-dimensional basis functions are employed:

$$\Lambda(x_r + j \cdot x_i) = \left(1 - \frac{|x_r|}{\delta}\right)\left(1 - \frac{|x_i|}{\delta}\right)$$

and $\Lambda(x)=0$, for $|x|>\delta$.

Consider the case where $\delta=1$ and the point x lies between four points $P_0$, $P_1$, $P_2$, $P_3$ equal to 0, 1, j and 1+j.

It can be shown that:

$$\hat{f}(x_r+j\cdot x_i)=(1-x_i)\cdot[(1-x_r)\cdot f(0)+x_r\cdot f(1)]+x_i\cdot[(1-x_r)\cdot f(j)+x_r\cdot f(1+j)]$$

This can be re-written using the basis functions:

$$\hat{f}(x)=\varphi_{0,0}\Lambda(x-(0+j0))+\varphi_{1,0}\Lambda(x-(1+j0))+\varphi_{0,1}\Lambda(x-(0+j1))+\varphi_{1,1}\Lambda(x-(1+j1))$$

where:

$$\varphi_{0,0}=f(0)$$

$$\varphi_{1,0}=f(1)$$

$$\varphi_{0,1}=f(j)$$

$$\varphi_{1,1}=f(1+j)$$

It can be verified that:

$$(1-|x_r|)(1-|x_i|)+|x_r|(1-|x_i|)+(1-|x_r|)|x_i|+|x_r||x_i|=1$$

and hence:

$$\Lambda(x)+\Lambda(1-x)+\Lambda(j-x)+\Lambda(1+j-x)-1$$

Thus, the coefficients of interpolation between the four points sum up to unity.

Figure 6:
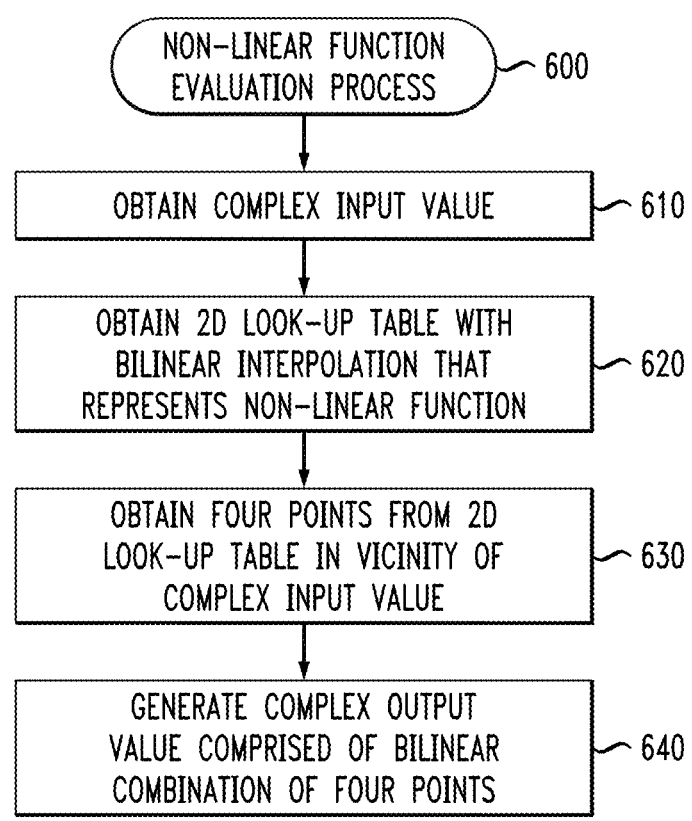
FIG. 6 is a flow chart describing an exemplary implementation of a non-linear function evaluation process incorporating aspects of the present invention.

FIG. 6 is a flow chart describing an exemplary implementation of a non-linear function evaluation process 600 incorporating aspects of the present invention. As shown in FIG. 6, a complex input value is obtained during step 610. A two-dimensional look-up table with bilinear interpolation representing the non-linear function is obtained during step 620.

Four points are then obtained from the two-dimensional look-up table during step 630 that are in a vicinity of the complex input value. For example, the four points may surround the complex input value. Finally, a complex output value comprised of a bilinear combination of the four points is generated during step 640.

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method for digital pre-distortion implemented using one or more hardware processors and a memory, the method comprising:

determining, using the one or more processors, a non-linear function that estimates actual output values of a power amplifier in response to respective complex input values;

using an optimization method including a least squares algorithm, recursive least squares (RLS) or least mean square (LMS) to determine coefficients of a piece-wise polynomial function that estimates the determined non-linear function, the coefficients substantially minimizing a mean square error of a difference between the non-linear function and the piece-wise polynomial function;

generating a plurality of two-dimensional look-up tables with bilinear interpolation, using the one or more hardware processors, by storing the coefficients as entries in the plurality of two-dimensional look up tables in the memory;

receiving, by the one or more processors, a complex value input corresponding to an actual input value;

identifying, using the one or more hardware processors, two closest entries, a first closest entry and a second closest entry, to the complex input value in a two-dimensional look-up table of the one or more two-dimensional look-up tables; wherein each of the plurality of two-dimensional look-up tables with bilinear interpolation are characterized as $\hat{f}(x)=\Sigma_{p=0}^{P-1}\Sigma_{q=0}^{P-1}\varphi_{p,q}\Lambda(x-(p+jq)\delta-\gamma$, where x is the complex input value, $\Lambda$ is a triangular basis function, $\varphi$ is the coefficient and $\gamma$ is a constant offset, P is complex point, p, q and $\delta$ are integer numbers;

evaluating, using the one or more hardware processors, the piece-wise polynomial function at the complex input value twice, a first evaluation using the coefficients corresponding to the first closest entry and a second evaluation using the coefficients corresponding to the second closest entry, to generate first and second output values;

generating, using the one or more hardware processors, an output value by performing a linear interpolation between the first and second output values; and determining an output of the power amplifier based on the generated output value.

2. The method of claim 1, wherein said non-linear function characterizes one or more of a power amplifier and an inverse of a power amplifier.

3. The method of claim 1, wherein said one or more two-dimensional look-up tables are used in a processor instruction as part of an instruction set of one or more of a scalar processor and a vector processor.

4. The method of claim 3, wherein said one or more two-dimensional look-up tables are stored in a memory of said one or more of a scalar processor and a vector processor, and the linear interpolation is performed as part of a user-defined non-linear instruction that takes the complex value input as an input, x, and computes f(x).

5. The method of claim 4, wherein said vector processor applies a complex input vector $[x_1, x_2, \ldots, x_N]$ to a plurality of non-linear functions $f_1, f_2, \ldots f_N$ to compute a complex vector output, $f_1(x_1), f_2(x_2) \ldots f_N(x_N)$.

6. A digital signal processor adapted for estimating an output value of a non-linear function based on a complex input value, the processor comprising:

a storage element adapted to store a plurality of two-dimensional look-up tables; and one or more processors coupled to the storage element, wherein the one or more processors are configured to:

determine the non-linear function, to estimate actual output values of a power amplifier in response to respective complex input values;

determine coefficients of a piece-wise polynomial function using an optimization method including a least squares algorithm, recursive least squares (RLS) or least mean square (LMS) to estimate the determined non-linear function for the plurality of two-dimensional look-up tables, the coefficients substantially minimize a mean square error of a difference between the non-linear function and the piece-wise polynomial function;

store the coefficients as entries in the plurality of two-dimensional look up tables in the storage element;

receive a complex value input based on an actual input value;

identify a first closest entry and a second closest entry to the complex input value in a two-dimensional look-up table of the plurality of two-dimensional look-up table; wherein each of the plurality of two-dimensional look-up tables with bilinear interpolation are characterized as $\hat{f}(x)=\Sigma_{p=0}^{P-1}\Sigma_{q=0}^{P-1}\varphi_{p,q}\Lambda(x-(p+jq)\delta-\gamma$, where x is the complex input value, $\Lambda$ is a triangular basis function, $\varphi$ is the coefficient and $\gamma$ is a constant offset, P is complex point, p, q and $\delta$ are integer numbers;

evaluate, using the one or more processors, the piece-wise polynomial function at the complex input value twice, a first evaluation using the coefficients corresponding to the first closest entry and a second evaluation using the coefficients corresponding to the second closest entry, to generate first and second output values;

generate, using the one or more processors, an output value by performing a linear interpolation between the first and second output values; and determine an output of the power amplifier based on the generated output value.

7. The digital signal processor of claim 6, wherein said non-linear function characterizes one or more of a power amplifier and an inverse of a power amplifier.

8. The digital signal processor of claim 6, wherein said at least one two-dimensional look-up table is used to implement digital pre-distortion.

9. The digital signal processor of claim 6, wherein said at least one two-dimensional look-up table is used in a processor instruction as part of an instruction set of one or more of a scalar processor and a vector processor.

10. The digital signal processor of claim 9, wherein said look-up table is stored in a memory of said one or more of the scalar processor and the vector processor, and the linear interpolation is performed as part of a user-defined non-linear instruction that takes the complex input value as an input, x, and computes f(x), wherein f(x) is the piecewise polynomial function output with linear interpolation based on multiple output values.

11. The digital signal processor of claim 10, wherein said vector processor applies a complex input vector $[x_1, x_2, \ldots, x_N]$ to a plurality of non-linear functions $f_1, f_2, \ldots f_N$ to compute a complex vector output, $f_1(x_1)$, $f_2(x_2) \ldots f_N(x_N)$.

* * * * *